United States Patent [19]

Nishimura et al.

[11] Patent Number: 4,486,672
[45] Date of Patent: Dec. 4, 1984

[54] DRIVE CIRCUITS FOR DRIVING DIGITAL CIRCUITS WITH A CLOCK SIGNAL

[75] Inventors: Toshimichi Nishimura, Sagamihara; Takashi Noguchi, Atsugi, both of Japan

[73] Assignee: Sony Corporation, Tokyo, Japan

[21] Appl. No.: 355,237

[22] Filed: Mar. 5, 1982

[30] Foreign Application Priority Data

Mar. 11, 1981 [JP] Japan ................... 56-33859

[51] Int. Cl.$^3$ .......................... H03K 5/12; H03K 5/02
[52] U.S. Cl. .................................... 307/268; 307/262; 307/269; 307/270; 307/288
[58] Field of Search ............... 307/268, 269, 262, 263, 307/288, 270, 313

[56] References Cited

U.S. PATENT DOCUMENTS 3,319,086  5/1967  Yee ....................................... 307/268
3,649,851  3/1972  Cohen ................................... 307/262

Primary Examiner—John Zazworsky
Attorney, Agent, or Firm—Hill, Van Santen, Steadman & Simpson

[57] ABSTRACT

A drive circuit comprises output transistors of complementary type serially coupled to each other between voltage supply terminals, auxiliary transistors of complementary type which have base electrodes respectively connected to the serial connection point between the output transistors and which are serially coupled between the respective base electrodes of the output transistors, and resistors serially coupled between the voltage supply terminals with their connection point coupled to the connection point of the auxiliary transistors. An input clock signal is supplied to the respective base electrodes of the output transistors via coupling capacitors, and an output clock pulse is derived from the serial connection point between the output transistors.

5 Claims, 4 Drawing Figures

DRIVE CIRCUITS FOR DRIVING DIGITAL CIRCUITS WITH A CLOCK SIGNAL

BACKGROUND OF THE INVENTION

1. Field of the Invention

This invention relates to drive circuits suitable for driving various digital circuits with a clock signal. More particularly, but not exclusively, the invention relates to drive circuits suitable for driving a frame transfer type charge coupled device (CCD) with a clock signal.

2. Description of the Prior Art

Recently, television cameras have come into use in which a CCD is utilized as a pick-up member or image sensor thereof. Since a CCD needs a clock signal in order to transfer the charges accumulated therein, a drive circuit such as that shown in FIG. 1 of the accompanying drawings has been used to drive the CCD with a clock signal. Such a drive circuit has to provide a clock signal of high frequency and to supply the clock signal to a supply terminal of the CCD which presents a large capacitance.

In the prior art drive circuit shown in FIG. 1, coupling capacitors $C_1$ and $C_2$ are charged and discharged to cause transistors $Q_1$ and $Q_2$ to be made ON alternately. Therefore, a driving clock signal can be derived from an output terminal OUT and then fed to the CCD (not shown). In this case, diodes $D_1$ and $D_2$ are used to perform the charging and discharging of the coupling capacitors $C_1$ and $C_2$ thereby to prevent the transistors $Q_1$ and $Q_2$ from being damaged.

However, this drive circuit has the inherent defect that the transistors $Q_1$ and $Q_2$ can be made ON only during the period when the coupling capacitors $C_1$ and $C_2$ are being charged, and it is impossible to prolong the duration of this period unless the capacitances of the coupling capacitors $C_1$ and $C_2$ are sufficiently large.

FIG. 2 of the accompanying drawings shows a prior art CCD, of the so-called frame transfer type, comprising a photosensitive image pick-up section 1, an accumulation or storage section 2, and a read-out register 3 respectively located as illustrated. In use of this CCD four suitably phased clock signals $\phi_{I1}$ to $\phi_{I4}$ are applied to the image pick-up section 1, four suitably phased clock signals $\phi_{S1}$ to $\phi_{S4}$ are applied to the storage section 2, and four suitably phased clock signals $\phi_{R1}$ to $\phi_{R4}$ are applied to the read-out register 3 to effect serial read-out via an amplifier 4. When such a frame transfer type CCD is employed, it is necessary to use clock signals, as shown in FIG. 3 of the accompanying drawings, having quite a long stop interval T corresponding to the photosensitive time, and also a pulse interval (pulse width t) which is of short period during transfer of the charges.

In this case, if a drive circuit as used previously and as illustrated in FIG. 1 is employed in association with the frame transfer type CCD, then coupling capacitors $C_1$ and $C_2$ of extremely large capacitances have to be provided to maintain the state that any one of the transistors $Q_1$ and $Q_2$ is completely turned ON. This will not only make the drive circuit as described rather impractical, but will also make the integrated circuit fabrication of such a drive circuit very difficult.

SUMMARY OF THE INVENTION

Therefore, an object of the present invention is to provide a drive circuit which can remove the defects inherent in the prior art drive circuits as described above.

Another object of the present invention is to provide a drive circuit utilizing coupling capacitors of low capacity which can positively or reliably respond to a clock signal with a waveform including a long stop interval T and a pulse interval with short period t as seen in FIG. 3, and drive a load.

Another object of the present invention is to provide an improved drive circuit for a charge coupled device.

According to the present invention there is provided a drive circuit comprising:

a pair of output transistors of opposite conductivity type connected in series between two voltage source terminals and each having a base electrode;

a pair of auxiliary transistors of opposite conductivity type connected in series between the respective base electrodes of said output transistors and each having a base electrode coupled to the series connection point between said output transistors;

a resistive path connected between said voltage source terminals and having an intermediate point coupled to the series connection point between said auxiliary transistors;

respective coupling capacitors by way of which an input clock signal is respectively applied to the base electrodes of said output transistors; and an output terminal coupled to the series connection point between said output transistors and from which an output clock signal is derived.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
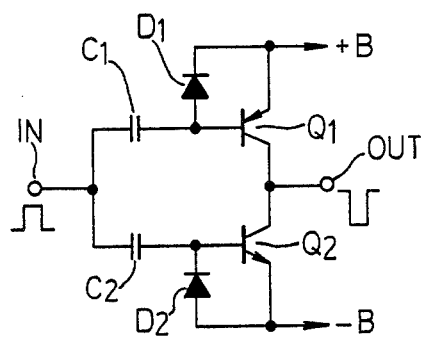
FIG. 1 is a circuit diagram of a prior art drive circuit.
Figure 2:
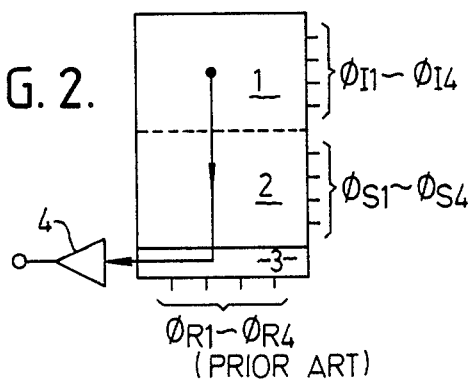
FIG. 2 is a schematic diagram used to explain a frame transfer system of a television camera in which a CCD is employed as the image sensor.
Figure 3:
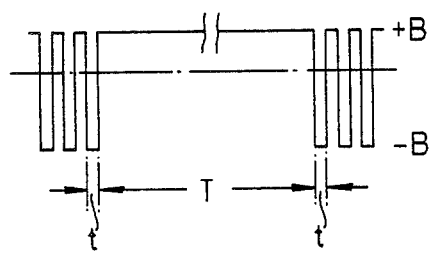
FIG. 3 is a waveform diagram showing a waveform of a clock signal which drives the CCD.
Figure 4:
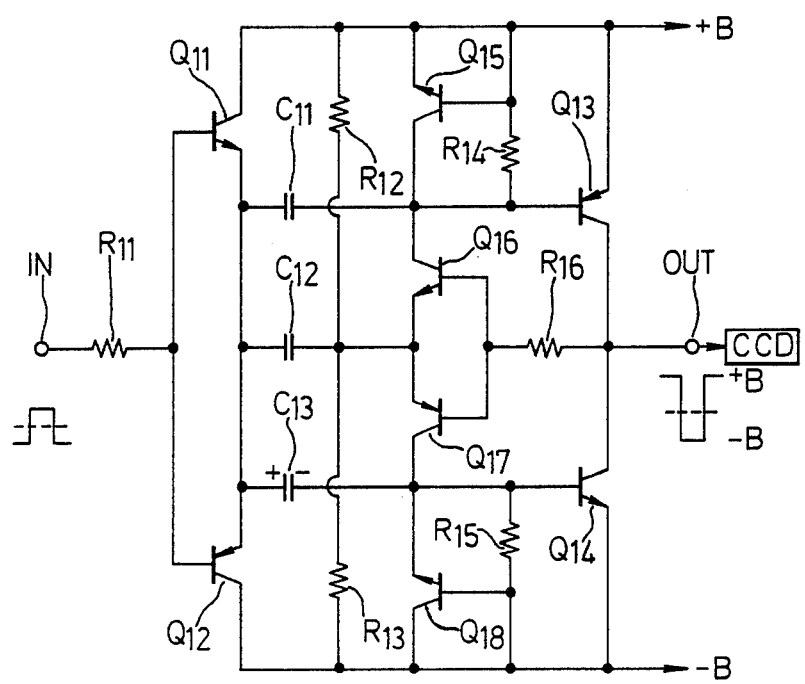
FIG. 4 is a circuit diagram showing an embodiment of drive circuit according to the invention.

Referring to FIG. 4, the embodiment of drive circuit to be described comprises complementary series-connected input transistors $Q_{11}$ and $Q_{12}$ that is, transistors of opposite conductivity type, the base electrodes of which are coupled to an input terminal IN via a common resistor $R_{11}$. The transistors $Q_{11}$ and $Q_{12}$ are provided to drive complementary series-connected output transistors $Q_{13}$ and $Q_{14}$ through coupling capacitors $C_{11}$ and $C_{13}$. The output transistors $Q_{13}$ and $Q_{14}$ are connected between voltage source terminals $+B$ and $-B$. The drive circuit also comprises discharging transistors $Q_{15}$ and $Q_{18}$ whose functions are nearly the same as those of the diodes $D_1$ and $D_2$ of the drive circuit of FIG. 1. Auxiliary complementary series-connected transistors $Q_{16}$ and $Q_{17}$ serve to maintain the ON-state of the output transistors $Q_{13}$ and $Q_{14}$. The drive circuit also comprises a speed-up capacitor $C_{12}$, series-connected resistors $R_{12}$ and $R_{13}$, resistors $R_{14}$ and $R_{15}$ operative to prevent hum noise entering the circuit, and a resistor $R_{16}$ serving to prevent misoperation due to noise. An output terminal OUT is connected to the series connection point of the output transistors $Q_{13}$ and $Q_{14}$.

The operation of the drive circuit of FIG. 4 will now be described.

As shown in FIG. 4, when a positive-going pulse is applied to the input terminal IN, the pulse is supplied through the resistor $R_{11}$ to the base of the complementary transistor $Q_{11}$ whereby the complementary transistor $Q_{11}$ is turned ON, while the other complementary transistor $Q_{12}$ is kept OFF. The emitter current of the complementary transistor $Q_{11}$ is passed through the coupling capacitor $C_{13}$ to the base of the output transistor $Q_{14}$ so as to drive the output transistor $Q_{14}$ ON. Thus the potential of the output terminal OUT is lowered, causing a current to flow through the resistor $R_{12}$ to the emitter-base path of the auxiliary transistor $Q_{17}$ to the resistor $R_{16}$ to the emitter-collector path of the transistor $Q_{14}$ which is in the ON state, so that the auxiliary transistor $Q_{17}$ is made ON. Consequently, the collector current derived from the auxiliary transistor $Q_{17}$ is supplied to the base of the output transistor $Q_{14}$ as the base current so that the ON state of the output transistor $Q_{14}$ is maintained irrespective of whether the coupling capacitor $C_{13}$ is charged.

Next, when the input pulse applied to the input terminal IN is falling or is a negative-going pulse, the negative voltage from the input terminal IN is supplied through the resistor $R_{11}$ to the base of the complementary transistor $Q_{12}$ so as to turn the complementary transistor $Q_{12}$ ON, and also thereby allowing the other complementary transistor $Q_{11}$ to be made OFF. The emitter current derived from the complementary transistor $Q_{12}$, which is at that time made ON, is supplied through the coupling capacitor $C_{11}$ to the base of the output transistor $Q_{13}$ so as to make the output transistor $Q_{13}$ ON. At the same time, due to the fact that the complementary transistor $Q_{12}$ is made ON, the voltage resulting from the charge in the coupling capacitor $C_{13}$ and which has a polarity as shown in the figure, is applied from the coupling capacitor $C_{13}$ across the base and emitter of the output transistor $Q_{14}$ as a reverse bias voltage which causes the output transistor $Q_{14}$ to be made OFF.

Accordingly, the electric potential at the output terminal OUT is raised to make the auxiliary transistor $Q_{17}$ OFF, the auxiliary transistor $Q_{17}$ having been ON up to that time. At the same time, current flows through resistor $R_{13}$ to the emitter-base path of the auxiliary transistor $Q_{16}$ to the resistor $R_{16}$ to the collector-emitter path of the output transistor $Q_{13}$ which is in the ON state, so that the auxiliary transistor $Q_{16}$ is made ON. Since the collector current derived from the collector of the auxiliary transistor $Q_{16}$ is supplied to the base of the output transistor $Q_{13}$ as the base current thereof in the same manner as previously described, the output transistor $Q_{13}$ is maintained ON thereafter. At that time, the charge accumulated in the coupling capacitor $C_{13}$ is discharged through the closed circuit which comprises the complementary transistor $Q_{12}$ and the discharging transistor $Q_{18}$.

Thereafter, the drive circuit repeatedly carries out the operations described above in response to the rising and falling of the input signal applied to the input terminal IN, thereby resulting in an output clock signal with a waveform as shown on the righthand side of FIG. 4, and which is inverted relative to that of the input signal shown on the lefthand side thereof, to be produced at the output terminal OUT. The output clock signal may be supplied to a charge coupled device (CCD).

Since the respective auxiliary transistors $Q_{16}$ and $Q_{17}$ are connected to the output transistors $Q_{13}$ and $Q_{14}$ such that they can each supply the base currents to the respective output transistors $Q_{13}$ and $Q_{14}$, the above state can be maintained even if the charging of the coupling capacitor $C_{11}$ or $C_{13}$ is completed and the current to be supplied therethrough disappears. Accordingly, the capacitances of the coupling capacitors $C_{11}$ and $C_{13}$ can be reduced, independently of the period of the clock signal applied to the input terminal IN.

In this case, the coupling capacitor $C_{12}$ is a speed-up capacitor used to quicken the inverting of the rising and falling of the input signal. The resistor $R_{16}$ is a resistor used to prevent the auxiliary transistors $Q_{16}$ and $Q_{17}$ from being misoperated by noise entering the drive circuit from the output terminal OUT. The resistors $R_{14}$ and $R_{15}$ are provided to prevent influences by hum noise from voltage sources terminals $+B$ and $-B$, but depending on the supply source, are not always required.

As an alternative to the voltage source terminals $+B$ and $-B$ for applying voltages to the output transistors $Q_{13}$ and $Q_{14}$, other independent voltage supply sources may be provided to apply the voltages to the complementary transistors $Q_{11}$ and $Q_{12}$. If the level of the input clock signal is large enough, these other voltage supply sources will be omitted and instead the input clock signal may be applied to the coupling capacitors $C_{11}$ and $C_{13}$ directly.

As described above, since the drive circuit of FIG. 4 retains the set state after the output transistors $Q_{13}$ and $Q_{14}$ have been inverted, not only when the period of the input clock signal is short but also when the period thereof is quite long, the drive circuit can be positively operated using coupling capacitors $C_{11}$ and $C_{13}$ of relatively small capacitances. Thus, the drive circuit has the advantage that it can readily be fabricated into an integrated circuit.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A drive circuit comprising:
    a pair of output transistors of opposite conductivity type having their emitter and collector terminals connected in series between two voltage source terminals, each of said output transistors having a base electrode;
    a pair of auxiliary transistors of opposite conductivity type having their emitter and collector terminals connected in series between the base electrodes of said output transistors, each of said auxillary transistors having a base electrode coupled to the common connection point between said ouput transistors;
    a resistive path connected between said voltage source terminals and having an intermediate point coupled to the common connection point between said auxillary transistors;
    coupling capacitors connected to the base electrodes of said output transistors for supplying an input clock signal to the base electrodes of said output transistors; and an output terminal coupled to the common connection point between said output transistors and from which an output clock signal is derived.

2. A drive circuit according to claim 1 including a pair of further transistors having their emitter and collector terminals connected in a series path with the emitter and collector terminals of said auxillary transistors for connecting said auxillary transistors to said voltage source terminals, said further transistors forming parts of respective discharge paths for said coupling capacitors.

3. A drive circuit according to claim 1 or claim 2 wherein a speed-up capacitor is coupled between the common connection point between said auxillary transistors and the terminal of each of said coupling capacitors opposite the end connected to said base electrodes.

4. A drive circuit according to claim 1 or claim 2 wherein said base electrodes of said auxiliary transistors are connected to said series-connection point between said output transistors by way of a resistor for reducing the effect of noise on the operation of said drive circuit.

5. A drive circuit according to claim 1 or claim 2 wherein said output terminal is coupled to a charge coupled device.

* * * * *